(12) United States Patent
Zhou et al.

(10) Patent No.: US 8,467,489 B2
(45) Date of Patent: Jun. 18, 2013

(54) DATA CLOCK RECOVERY SYSTEM AND METHOD EMPLOYING DELAYED DATA CLOCK PHASE SHIFTING

(75) Inventors: Dacheng (Henry) Zhou, Fort Collins, CO (US); Barry J. Arnold, Fort Collins, CO (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 2525 days.

(21) Appl. No.: 11/210,929

(22) Filed: Aug. 24, 2005

(65) Prior Publication Data
US 2007/0047684 A1    Mar. 1, 2007

(51) Int. Cl.
*H04L 7/00*        (2006.01)

(52) U.S. Cl.
USPC .................. 375/371; 375/355; 375/354

(58) Field of Classification Search
USPC .......................... 375/371, 355, 354
See application file for complete search history.

(56) References Cited

U.S. PATENT DOCUMENTS

| | | |
|---|---|---|
| 3,944,940 A | 3/1976 | Desai |
| 4,216,544 A | 8/1980 | Boleda et al. |
| 4,275,465 A | 6/1981 | Lemoussu |
| 4,287,596 A | 9/1981 | Chari |
| 4,534,044 A | 8/1985 | Funke et al. |
| 4,568,881 A | 2/1986 | Kostrov |
| 4,677,614 A * | 6/1987 | Circo ............................ 370/222 |
| 4,996,444 A | 2/1991 | Thomas et al. |
| 5,124,669 A | 6/1992 | Palmer et al. |
| 5,235,596 A | 8/1993 | Sporer |
| 5,854,717 A | 12/1998 | Minuhin |
| 6,028,727 A | 2/2000 | Vishakhadatta et al. |
| 6,377,575 B1 | 4/2002 | Mullaney et al. |
| 6,693,985 B2 | 2/2004 | Li et al. |
| 6,700,886 B2 | 3/2004 | Mullaney et al. |
| 6,788,350 B2 | 9/2004 | Zimmermann |
| 6,853,223 B2 | 2/2005 | Ebuchi et al. |
| 6,871,304 B2 | 3/2005 | Hadjihassan et al. |
| 2002/0085656 A1 * | 7/2002 | Lee et al. ....................... 375/355 |
| 2003/0227990 A1 | 12/2003 | Hsu et al. |
| 2004/0247049 A1 * | 12/2004 | Maddux ........................ 375/327 |
| 2005/0091559 A1 | 4/2005 | Vining |

* cited by examiner

*Primary Examiner* — Shuwang Liu
*Assistant Examiner* — Michael Neff

(57) ABSTRACT

A data clock recovery system is provided. A phase detector is configured to sample an input data stream by way of a data clock and a second clock to generate a first signal indicating whether a data clock lags or leads a preferred phase of the data clock in relation to an input data stream. A phase controller is configured to process the first signal to shift a phase of the second clock toward a second preferred phase, and to shift a phase of the data clock toward the first preferred phase after the shifting of the phase of the second clock.

36 Claims, 12 Drawing Sheets

DATA CLOCK RECOVERY SYSTEM AND METHOD EMPLOYING DELAYED DATA CLOCK PHASE SHIFTING

BACKGROUND

In virtually all communication systems, data is transferred from a transmitting node of the communication system to a receiving node over a communication path. Such a path may be a wired or wireless connection between the communicating nodes. In many of these systems, the data take the form of a digital signal transferred at a substantially constant rate over the connection. Normally, the data signal presents a series of binary digits ("bits") that represent the digital information being transmitted to form a serial communication path. Further, several such series of bits transferred simultaneously may form a multi-path, parallel communication connection.

Some communication systems also supply a data clock signal over the same connection to provide timing information for the data signal. Typically, the data signal is sampled, or "clocked," at each logic "low" to logic "high" transition of the data clock to identify each bit being transferred. However, other communication systems do not provide a clock signal along with the data signal over the connection, instead relying on the receiving node's knowledge of the transfer rate of the data signal to allow proper interpretation of the data signal.

Unfortunately, drift of the data signal frequency, variations in the frequency of a local oscillator from which the data clock is derived, and similar problems may cause the receiving node to improperly clock the data signal. To counteract such problems, the receiving node is often equipped with a data clock recovery system to help ensure proper sampling of the data signal.

One example of such a system 100 is shown in FIG. 1. A data sampler 102 samples an input data stream 110 received over a communication system connection by way of a data clock 112, resulting in a sampled input data stream 114 for use by the receiving node. The data sampler 102 also compares the phase of the input data stream 110 with the data clock 112 by sampling near the logic transitions of the input data stream 114 by way of an edge clock 113, in addition to the sampled input data stream 114. Based on the values of the input data stream 110 as sampled by the data clock 112 and the edge clock 113, the data sampler 102 generates a phase difference signal 118 indicating if the transitions of the data clock 112 are being generated early ("leading") or late ("lagging") compared to a preferred phase. Typically, the preferred phase of the data clock 112 results in sampling the input data stream 110 at substantially the midpoint between the transitions of the input data stream 110 to help avoid sampling while the input data stream 110 is transitioning between logic states. Thus, the edge clock 113 is essentially 180 degrees out of phase with the data clock 112. FIG. 2 illustrates the relative phase relationship between the input data stream 110, the data clock 112, and the edge clock 113 under ideal conditions.

More specifically, if a value of the input data stream 110 is the same at a rising edge of the edge clock 113 and the next rising edge of the data clock 112, the phase difference signal 118 may indicate the data clock 112 lags its preferred phase. Conversely, if the values of the input data stream 110 at the rising edge of the edge clock 113 and the next rising edge of the data clock 112 are different, the phase difference signal 118 may indicate the data clock 112 leads its preferred phase.

In the particular implementation of FIG. 1, the data clock 112 and the edge clock 113 are derived from a multiphase local clock 116 originating in the receiving node. These phases are shown in the timing diagram of FIG. 3 as CP0-CP3, thus indicating that the multiphase clock 116 provides four phases spaced 90 degrees apart. In addition, other phases of the local clock 116 (indicated as CI01-CI03, CI11-CI13, CI21-CI23, and CI31-CI33) are generated by way of a phase interpolator 108 driven by the local clock 116. In the particular example of FIG. 2, sixteen total phases are supplied by the phase interpolator 108, which employs one of these phases as the data clock 112 to produce the sampled data input stream 114, and another approximately 180 degrees out of phase with the data clock 112 as the edge clock 113.

A counter 104 takes the phase difference signal 118 as input to produce a phase count 120, which accumulates the phase indications provided by the phase difference signal 118. More specifically, for each bit period in which the data clock 112 lags its preferred phase, the counter 104 increments the phase count 120 by one. Conversely, for each bit period in which the data clock 112 leads the preferred phase, the counter 104 decrements the phase count 120 by one.

In further reference to FIG. 1, a threshold comparator 106 compares the phase count 120 with a threshold value. The threshold value is typically utilized to prevent unnecessary adjustments in the phase of the data clock 112 in reaction to noise or temporary phase misalignment between the data clock 112 and the input data stream 110. If the phase count 120 exceeds the threshold, or falls below the negative of the threshold, the threshold comparator 106 produces a pulse on a phase shift signal 122 to either advance or delay the phase of the data clock 112 and the edge clock 113 simultaneously, depending on the sign of the phase count 120. Once the pulse on the phase shift sign 122 is generated, the counter 104 resets the phase count 120 to zero. In one example, the phase shift signal 122 includes two separate signal lines, with one line providing pulses to delay the phase of the data clock 112 and the edge clock 113 by a portion of a period, and another line supplying pulses to advance the phase of the data clock 112 and the edge clock 113 by a portion of a period.

The phase shift signal 122 is accepted as input by the phase interpolator 108, described above, to drive the data clock 112 and the edge clock 113 with the appropriate phases of the local clock 116 or any of its interpolated phases, as depicted in FIG. 3. For example, if the data clock 112 is currently derived from interpolated clock phase C122, the edge clock 113 would be derived from the interpolated clock phase C102, which is 180 degrees out of phase with the interpolated clock phase CI22. If the phase shift signal 122 then indicates that the phase of the data clock 112 utilized to produce the sampled input data stream 114 should be delayed, the phase interpolator 108 begins deriving the data clock 112 from interpolated clock phase C123, and the edge clock 113 from interpolated clock phase C103. Adjusting the phase in this manner allows the rising transitions of the data clock 112 to more closely align with the midpoint of each bit period of the input data stream 110.

FIG. 4 presents an idealized timing diagram of a common scenario in which the frequency of the input data stream 110 and the data clock 112 are closely matched. The preferred phase of the data clock 112 in this example is shown by way of vertical dotted lines in FIG. 4. Also, a threshold of 64 is presumed in this particular example. In addition, the logic state of the input data stream 110 is presumed to change every bit period to provide phase information concerning the data clock 112 and the edge clock 113 for every period of the data clock 112.

Presuming the data clock 112 slightly lags its preferred phase, the phase difference signal 118 generated by the data sampler 102 indicates this state during each period of the data clock 112. As a result, the counter 104 increments the phase count 120 each data clock 112 period in which it lags its preferred phase. Once the phase count 120 reaches the threshold value of 64, the threshold comparator 106 indicates by way of the phase shift signal 122 for the phase interpolator 108 to slightly advance the phase of the data clock 112 and the edge clock 113, typically by way of an advance pulse 150. Also, the counter 104 resets the phase count 120.

Once the phase interpolator advances the phase of the data clock 112 and the edge clock 113 by way of the local clock 116, the data clock 112 leads its preferred phase for several data clock 112 cycles, as indicated by the phase difference signal 118 from the data sampler 102. As a result, the counter 104 causes the phase count 120 to decrement for several data clock 112 cycles, thus being reduced in value from 0 to −64, causing the threshold comparator 106 to indicate via a delay pulse 152 of the phase shift signal 122 to the phase interpolator 108 to delay the phase of the data clock 112 and the edge clock 113. Once this phase shift has been accomplished, the phase count 120 is reset, and the data clock 112 lags its preferred phase, causing the cycle to begin anew.

Thus, the data clock recovery circuit 100 may induce a somewhat periodic phase shifting of the data clock 112 when in fact the frequencies of the input data stream 110 and the data clock 112 are nearly identical. Such unnecessary phase shifting of the data clock 112 results in "phase jitter" between the data clock 112 and the input data stream 110, which typically induces reduced link performance and limited data transfer rates, due the resulting phase instability of the data clock 112.

SUMMARY

One embodiment of the present invention provides a data clock recovery system for a communication system. A phase detector is configured to sample an input data stream by way of a data clock and a second clock to generate a first signal indicating whether the data clock lags or leads a first preferred phase in relation to the input data stream. A phase controller is configured to process the first signal to shift a phase of the second clock toward a second preferred phase, and to shift a phase of the data clock toward the first preferred phase after the shifting of the phase of the second clock.

In another embodiment of the invention, a method for recovering data clock information from a communication signal is provided. An input data stream is sampled via a data clock and a second clock. The sampling of the input data stream is utilized to generate a first signal indicating whether the data clock lags or leads a first preferred phase in relation to the input data stream. A phase of the second clock is shifted based on the first signal toward a second preferred phase. Also, a phase of the data clock is shifted toward the first preferred phase on a delayed basis compared to the shifting of the phase of the second clock.

Additional embodiments and advantages of the present invention will be realized by those skilled in the art upon perusal of the following detailed description, taken in conjunction with the accompanying drawings.

DETAILED DESCRIPTION

Figure 5:
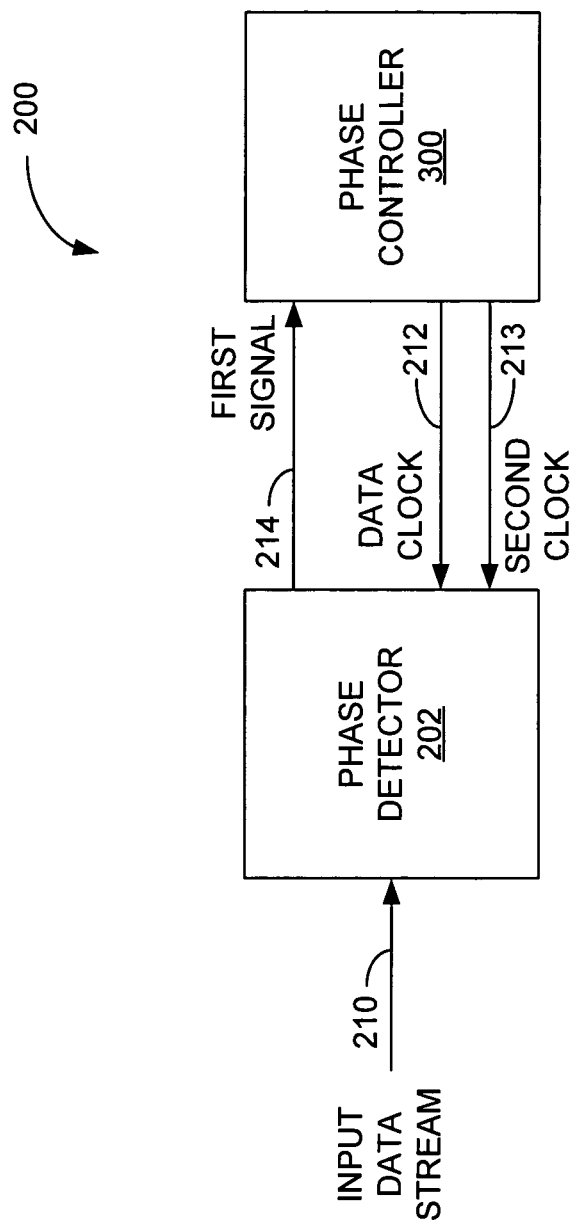
FIG. 5 is a block diagram of a data clock recovery system according to an embodiment of the invention.

A data clock recovery system 200 according to an embodiment of the invention is presented in FIG. 5. Generally, a phase detector 202 is configured to sample an input data stream 210 by way of a data clock 212 and a second clock 213 to produce a first signal 214 indicating whether the data clock 212 lags or leads a first preferred phase in relation to the input data stream 210. In one embodiment, the input data stream 210 is received over a communication system connection or path. The system 200 also includes a phase controller 300 configured to process the first signal 214 to shift the phase of the second clock 213 toward a second preferred phase. The phase controller 300 is also configured to shift the phase of the data clock 212 toward the first preferred phase after the phase of the second clock 213 has been shifted. In other words, the shifting of the data clock 212 phase is delayed compared to the shifting of the second clock 213.

In one embodiment, the first preferred phase of the data clock 212 is aligned substantially at the midpoint between transitions of the input data stream 210. This first preferred phase is often selected in order to avoid sampling at or near logic state transitions of the input data stream 210. In a particular implementation, the second clock 213 has a frequency essentially equal to that of the data clock 212, but has a second preferred phase essentially aligned with the logical state transitions of the input data stream 210. Employing the data clock 212 and the second clock 213 with these characteristics allows the phase detector 202 to sample the input data stream 210 at or near the logic transitions and the midpoints of the input data stream 210 to help detect the relative location of the state transitions to determine whether the data clock 212 leads or lags its preferred phase. However, unlike the data clock recovery system 100 discussed above, the data clock and the second clock 213 are not required to maintain a strict 180-degree phase separation therebetween at all times, as is described in greater detail below.

In one embodiment, the first signal 214 produced by the phase detector 202 generates a pulse once per data clock 212 period that indicates whether the phase detector 202 has determined the data clock 212 leads or lags the midpoint of the corresponding input data stream 210 bit period. In one particular implementation, the first signal 214 is employed on two separate signal lines, one line which carries logic pulses indicating the data clock 212 leads the midpoint, and one line which carries logic pulses indicating the data clock 212 lags the midpoint. Many other methods for implementing the first signal 214 may be employed in alternative implementations.

In one embodiment, the phase detector 202 may determine the relative phase of the data clock 212 compared to the first preferred phase once per period. In alternative embodiments, the data sampler 202 may make this determination less often, such as once every two or more data clock 212 cycles.

Figure 6:
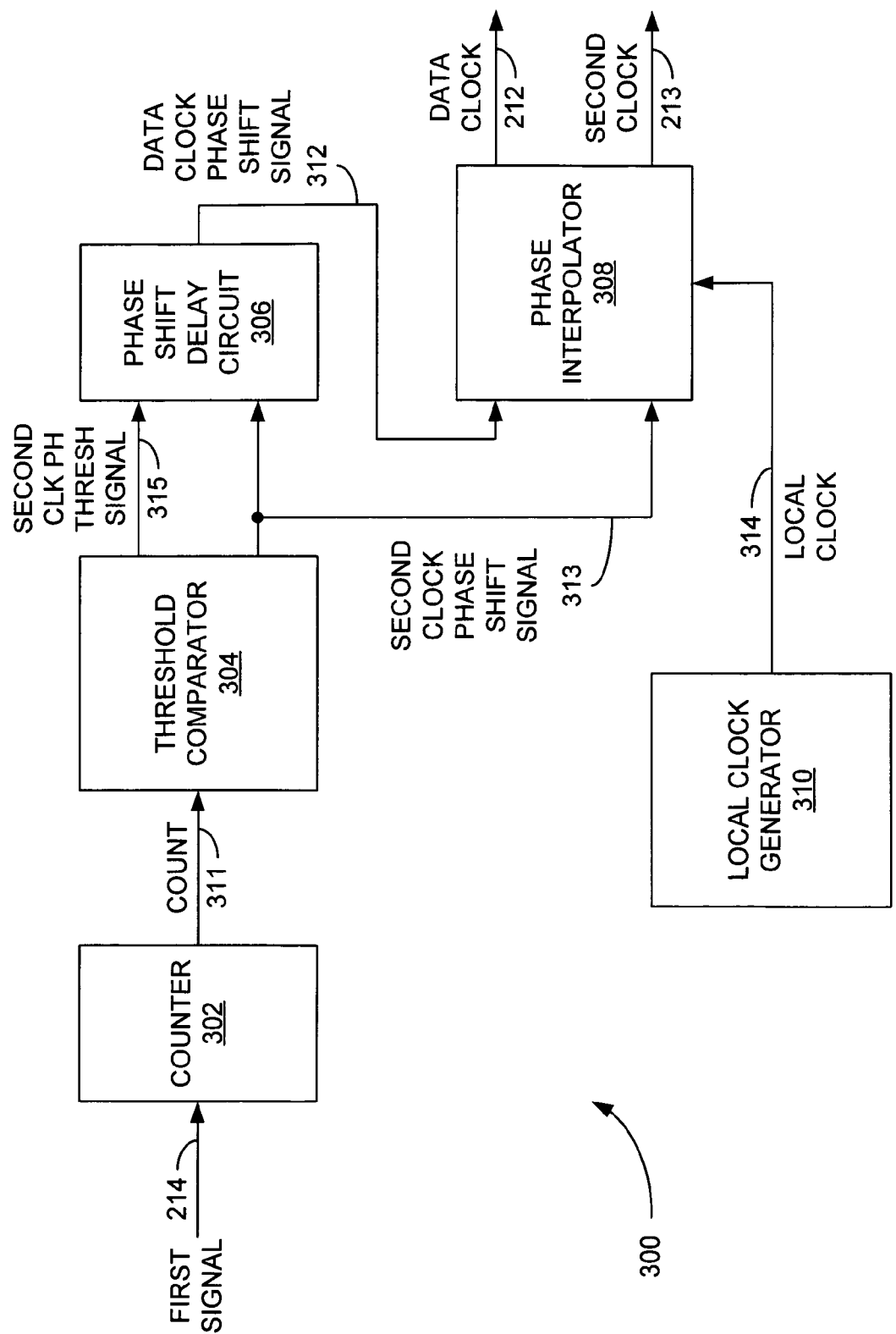
FIG. 6 is a block diagram of a phase controller employed by the data clock recovery system of FIG. 5 according to a particular embodiment of the invention.

FIG. 6 illustrates one particular example of the phase controller 300 according to an embodiment of the invention. A counter 302 generates a count 311 from the first signal 214. The counter 302, in one particular implementation, counts pulses of the first signal 214 to generate the count 311. More specifically, each pulse of the first signal 214 indicating the data clock 212 lags the midpoint of the input data stream 210 may cause the counter 302 to increment the first count 311, while each pulse indicating the data clock 212 lagging the midpoint may cause the counter 302 to decrement the count 311. In this case, the count 311 represents a running value generally indicating the relative phase of the data clock 212 and the first preferred phase to help determine if any correction of the data clock 212 phase is necessary to maintain the data integrity of data received from the input data stream 210.

Continuing with FIG. 6, a threshold comparator 304 is configured to generate a second clock phase shift signal 313 when an absolute value of the count 311 exceeds a first threshold. In one embodiment, the comparator 304 performs the comparison each time the count 311 is updated. For example, in implementations in which the count 311 changes once per data clock 212 period, the threshold comparator 304 may also perform the comparison once per data clock 212 period. In alternative implementations, the count 311 may be updated less often, thus allowing the comparison to occur at a lower frequency.

If the count 311 exceeds the first threshold, the second clock phase shift signal 313 is activated. In addition, the counter 302 resets the count 311 back to zero. In one embodiment, activation of the second clock phase shift signal 313 occurs by way of a pulse indicating a direction for shifting the phase of the second clock 213. For example, two signal lines may be employed for the second clock phase shift signal 313 such that a pulse on one line indicates advancing the phase of the second clock 213, while a pulse on the other line indicates delaying the phase. In that case, a positive value of the count 311 that exceeds the first threshold causes a pulse of the second clock phase shift signal 311 indicating advancement of the second clock 213 phase. Similarly, the absolute value of a negative count 311 that exceeds the first threshold generates a pulse of the second clock phase shift signal 313 indicating a desired delay in the phase of the second clock 213. The pulses of the second clock phase shift signal 313 thus shift the phase of the second clock 213 toward the second preferred phase referenced above.

Generally, the counter 302 and the threshold comparator 304 operate in tandem as a filter to prevent shifting the phase of the second clock 213 based upon each indication of the first signal 214. More specifically, a pattern of the data clock 212 leading or lagging the midpoint of several bit periods of the input data stream 210 may be required before activation of the second clock phase shift signal 313. Without such filtering, slight alterations in phase difference between the data clock 212 and the first preferred phase may cause unnecessary adjustments in the phase of the second clock 213.

In addition, the threshold comparator 304 also compares the count 311 to a second threshold. In one embodiment, this second comparison occurs after the count 311 has exceeded the first threshold and has been subsequently reset. If the count 311 exceeds the second threshold, a second clock phase threshold signal 315 is generated, the function of which is described in greater detail below. In one embodiment, the second threshold is much less than the first threshold to ensure that the second clock 213 is not advanced or delayed twice before the data clock 212 has been shifted once, thus allowing the data clock 212 and the second clock 213 to retain their phase relationship within a single phase step. For example, if the first threshold is in the range of 64 to 128, the second threshold may be located in the range of 8 to 16.

Figure 1:
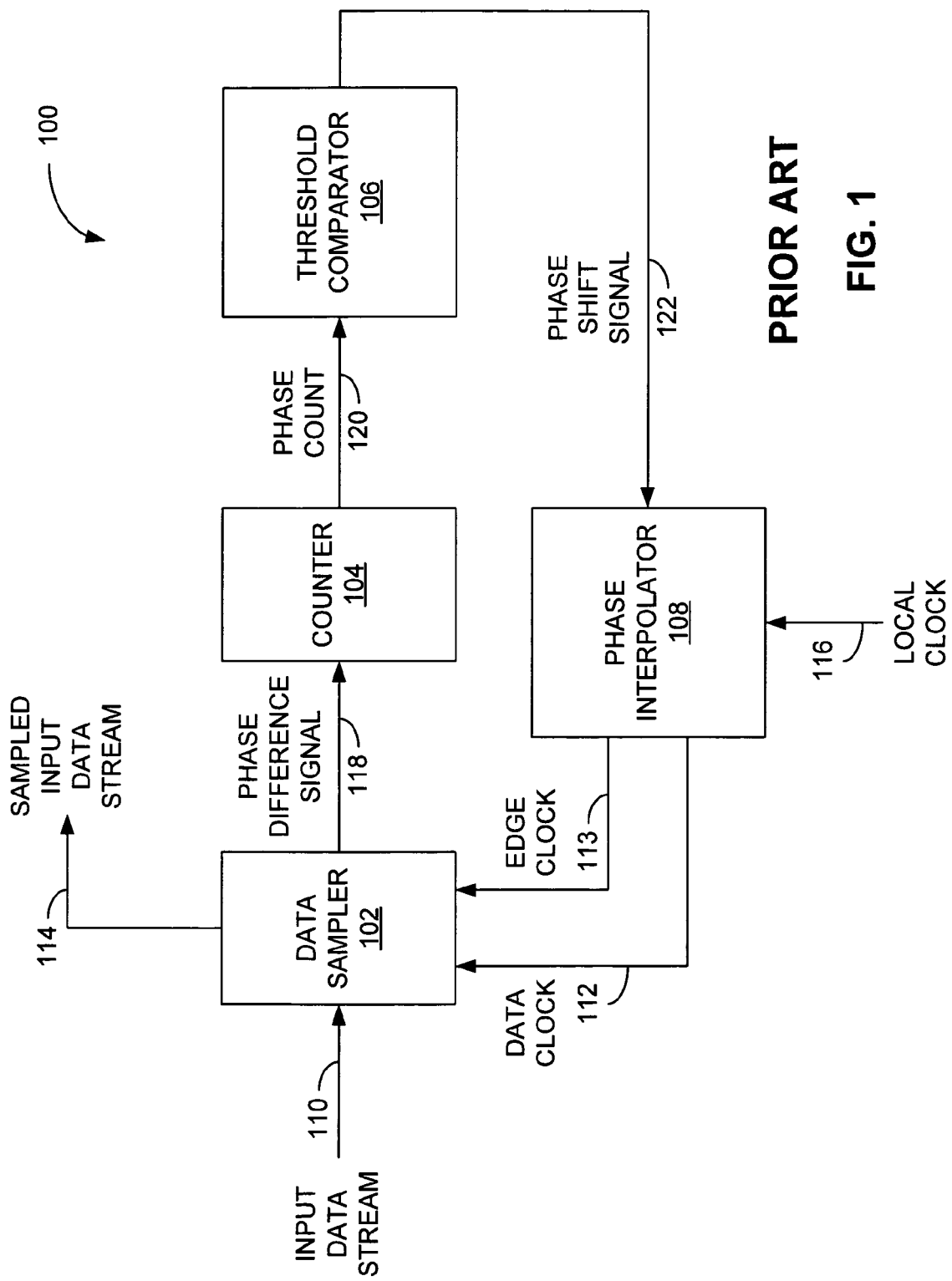
FIG. 1 is a block diagram of a data clock recovery system from the prior art.
Figure 2:
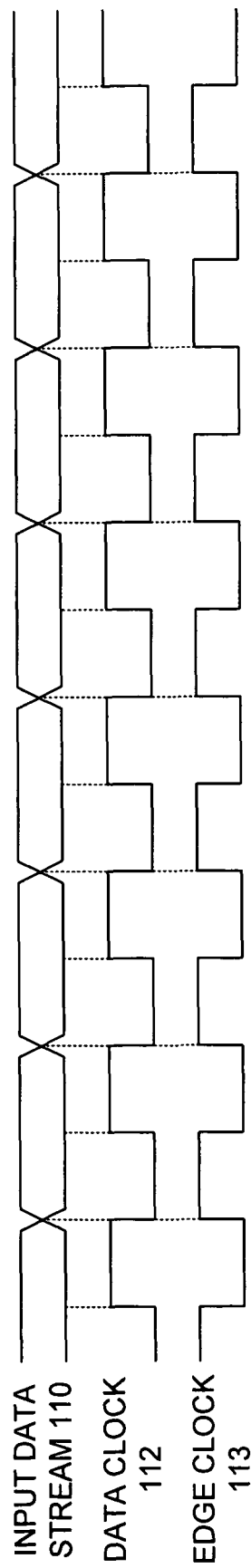
FIG. 2 is a timing diagram of an input data stream, data clock, and edge clock associated with the data clock recovery system of FIG. 1 from the prior art.

Unlike the phase shift signal 122 of the data clock recovery system 100 of FIG. 1, the pulses of the second clock phase shift signal 313 of the phase controller 300 do not immediately result in phase shifts for the data clock 212. Instead, the second clock phase shift signal 313 drives a phase shift delay circuit 306 which processes the second clock phase shift signal 313 and the second clock phase threshold signal 315 to generate a data clock phase shift signal 312. In some embodiments, the phase shift delay circuit 306 delays any shifting of the data clock 212 phase until the first signal 214 indicates that the data clock 212 must still be shifted toward the first preferred phase after the phase of the second clock 313 has been shifted.

In one embodiment, the data clock phase shift signal 312 exhibits a pulse for each shift of the phase of the data clock 212 desired. In a particular embodiment, the data clock phase shift signal 312 is propagated on two separate signal lines, one carrying pulses indicating advancement of the data clock 212, and one carrying pulses indicating delay of the data clock 212.

Figure 3:
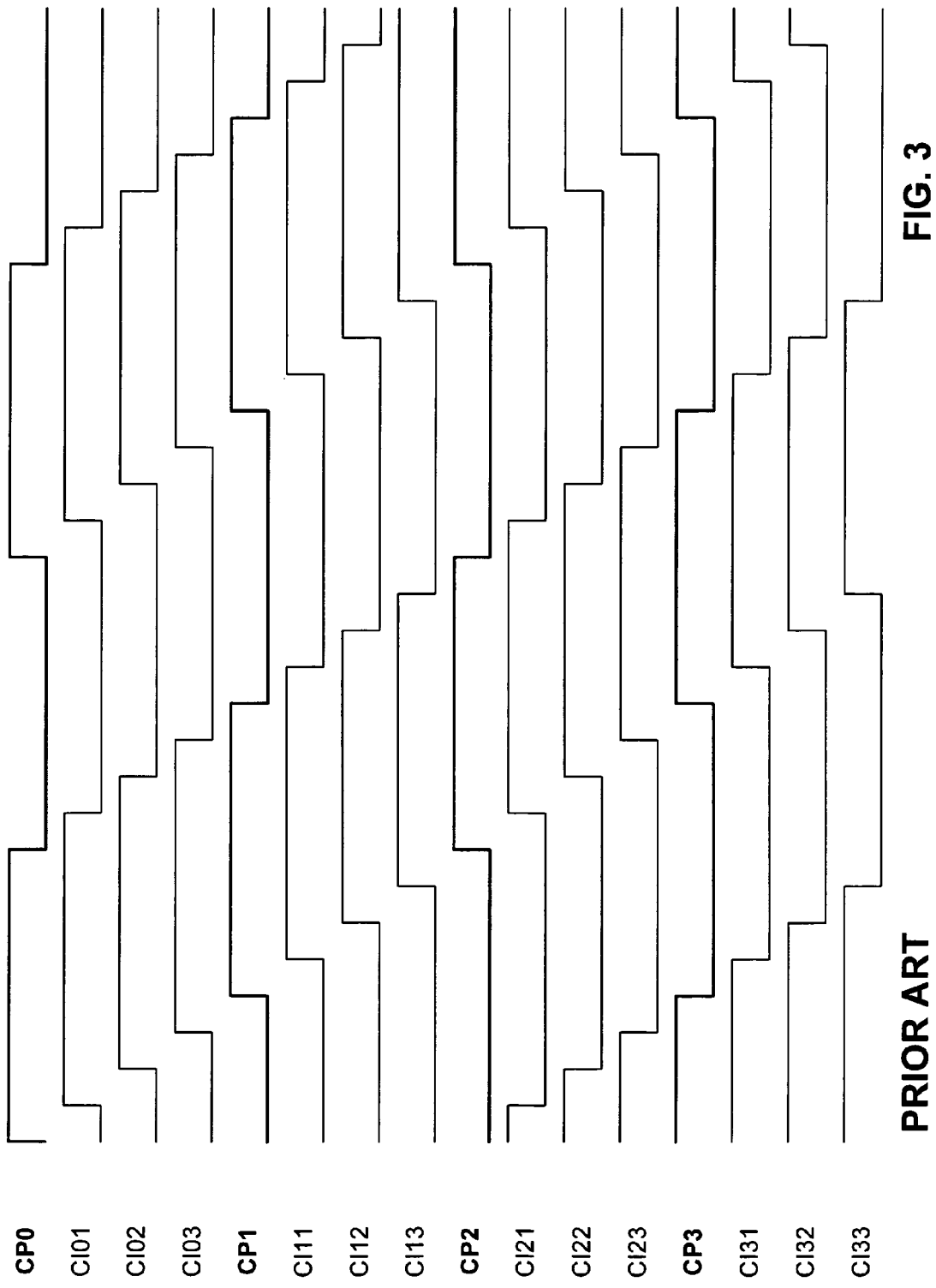
FIG. 3 is a timing diagram of a multiphase clock generated by a phase interpolator of the data clock recovery system of FIG. 1 from the prior art.
Figure 4:
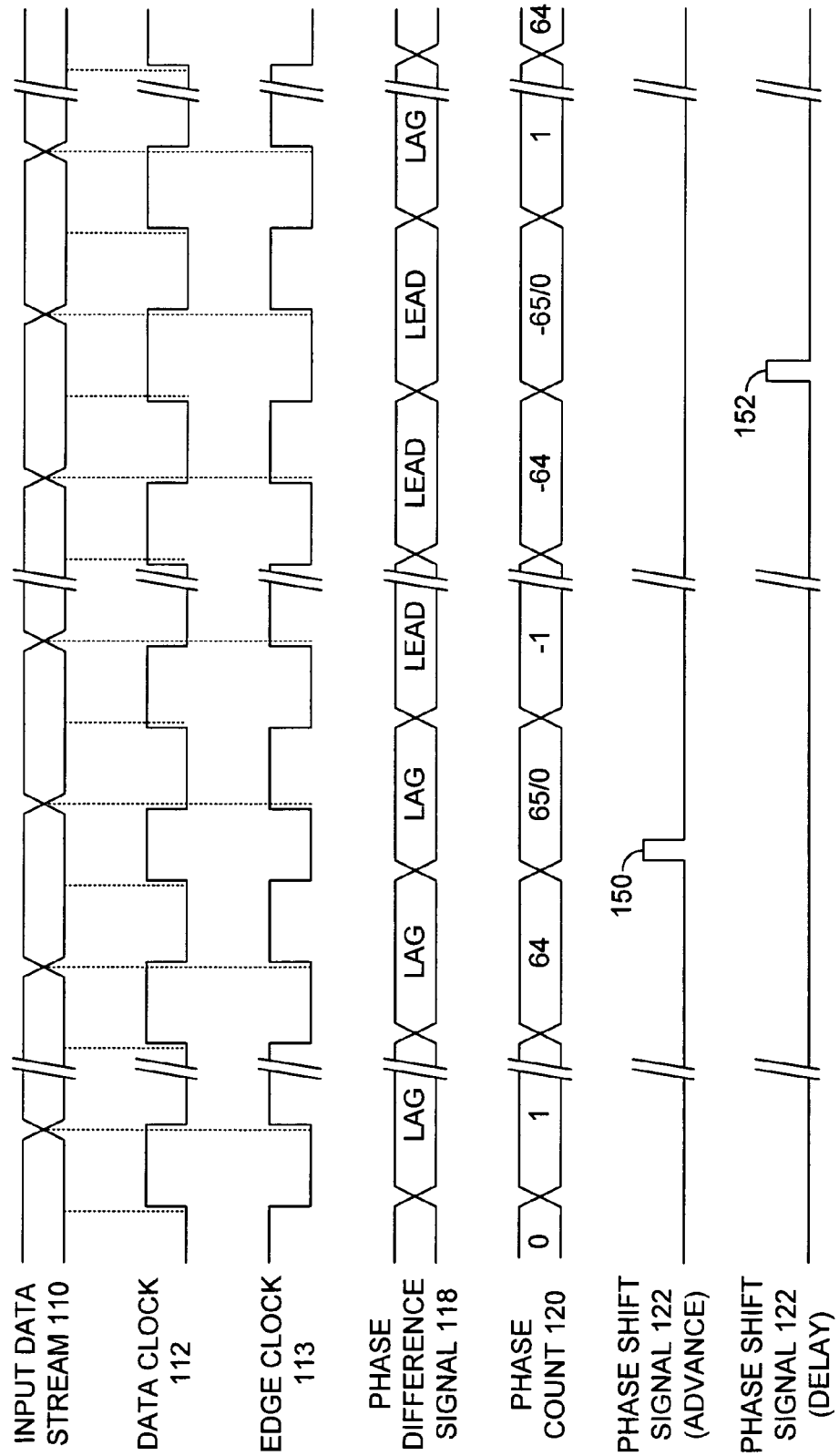
FIG. 4 is a simplified timing diagram illustrating the operation of the data clock recovery system of FIG. 1 from the prior art.

Returning to FIG. 6, each pulse of the data clock phase shift signal 312 and the second clock phase shift signal 313 instructs a phase interpolator 308 to independently advance or delay the phase of the corresponding data clock 212 and second clock 213 by one phase "step." In a further embodiment, the phase angle represented by a single step is determined by the number of clock phases provided by the phase interpolator 308. In one example, the phase interpolator 308 may be driven by a local clock 314 generated by a local clock generator 310. The local clock 314 may be a clock supplying multiple phases, such as the clock phases CP0-CP3 shown in FIG. 3. In addition, the phase interpolator 308 may provide multiple interpolated clock phases CI01-CI03, CI1-CI13, CI21-CI23, and CI31-CI33 between corresponding phases of the local clock 314. In alternative embodiments, more or fewer clock phases, either interpolated or existing as a phase of a multiphase clock, may be utilized to similar end.

Any of the multiphase clock phases CP0-CP3 and the interpolated clock phases may be selected by the phase interpolator 308 at the direction of the data clock phase shift signal 312 for the data clock 212 to attain the first preferred phase. The interpolator 308 operates in the same manner regarding the second clock 213 at the direction of the second clock phase shift signal 313. For example, if the current data clock 212 is interpolated clock CI23, and a pulse of the data clock phase shift signal 312 indicates that the data clock 212 should be advanced one step, the next leading phase, interpolated clock CI22, would become the data clock 212. Conversely, if the current data clock 212 is the clock phase CP1, and the data clock phase shift signal 312 forces a delay of one step, the interpolated clock phase CI11 becomes the data clock 212.

Figure 7:
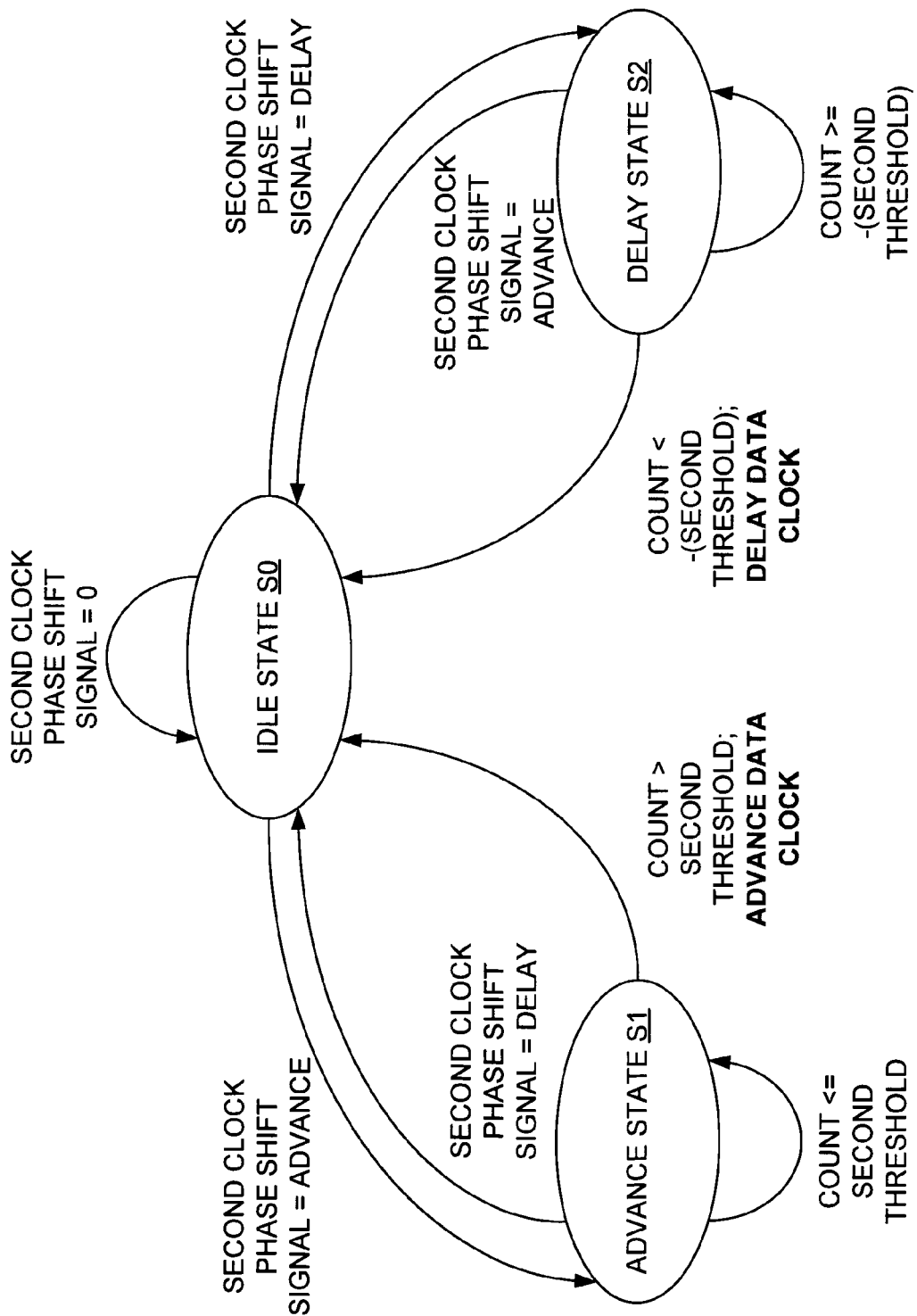
FIG. 7 is a state diagram illustrating the operation of a phase shift delay circuit of the phase controller of FIG. 6 according to an embodiment of the invention.

One specific embodiment of the phase shift delay circuit 306 may be implemented in the form of a circuit implementing a state machine. The operation of the phase shift delay circuit 306 according to one embodiment of the invention is presented in the form of a state diagram 400 of FIG. 7 describing the operation of the state machine. Initially, the state machine exhibits an idle state S0, which is maintained while the second clock phase shift signal 313 is not active (i.e., not indicating a shift for the second clock 213). Once the second clock phase shift signal 313 indicates advancement of the second clock 213, the state machine transitions to the advance state S1. If, instead, the second clock phase shift signal 313 indicates a delay of the second clock 213, the state machine transitions from the idle state S0 to the delay state S2.

Assuming the current state is the advance state S1, this state is maintained while the count 311, after being reset as a result of exceeding the first threshold, remains less than or equal to the second threshold. However, if in the meantime the second clock phase shift signal 313 indicates that delaying the second clock 213 is necessary, the state machine returns to the idle state S0. Otherwise, if the count 311 exceeds the second threshold, indicating the data clock 212 is still lagging the first preferred phase, the state machine returns to the idle state S0, and the data clock phase shift signal 312, driven by the phase shift delay circuit 306, indicates to the phase interpolator 308 that the data clock 212 is to be advanced one phase increment. As a result, the shifting of the data clock 212 occurs after the shifting of the second clock 213 by a number of bit periods equal to the second threshold.

Presuming instead that the state machine has transitioned from the idle state S0 to the delay state S2, this state is maintained while the count 311, after being reset subsequent to exceeding the first threshold, remains greater than or equal to the negative of the second threshold. If the second clock phase shift signal 313 indicates that advancing the phase of the second clock 213 is required, the state machine returns to the idle state S0. If, however, the count 311 attains a value less than the negative of the second threshold, the state machine returns to the idle state S0, and the data clock phase shift signal 312 of the phase shift delay circuit 306 indicates that the data clock 212 is to be delayed one phase step.

Figure 8:
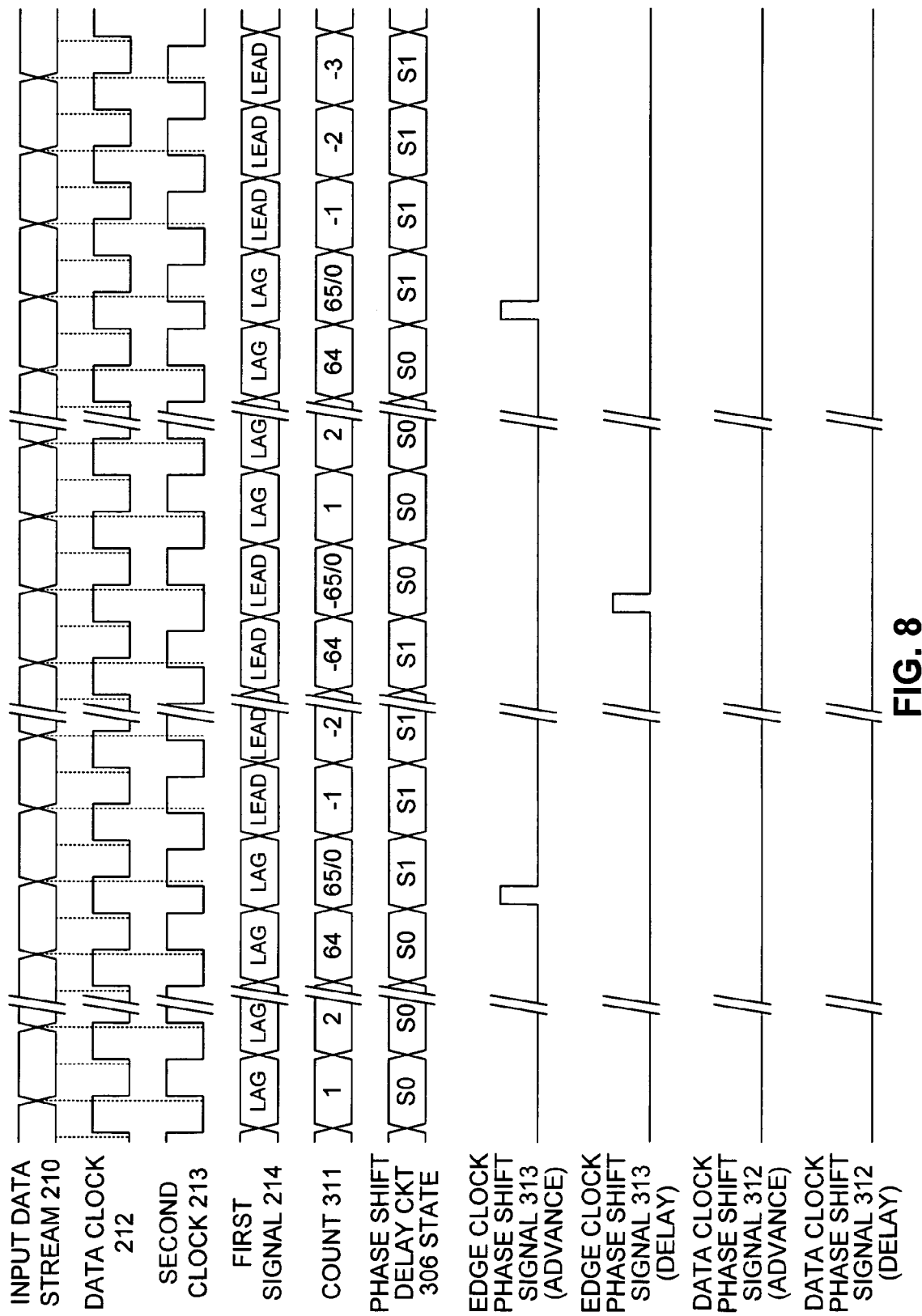
FIG. 8 is a simplified timing diagram illustrating the operation of the data clock recovery system of FIG. 5 employing the phase controller of FIG. 6 according to an embodiment of the invention when the data input stream and the data clock have closely matched frequencies.

FIG. 8 provides a simplified timing diagram depicting the operation of the data clock recovery system 200 for a given input data stream 210 according to an embodiment of the invention. In this particular example, the frequency of the input data stream 210 is very close to that of the data clock 212 and the second clock 213, and the phase shift delay circuit 306 begins in the idle state S0. Also, the data clock 212 and the second clock 213 slightly lag the first and second preferred phases compared to the input data stream 210. Accordingly, the first signal 214 from the phase detector 202 indicates that the data clock 212 lags the first preferred phase for a series of bit periods while the counter 302 increments the count 311 each of those bit periods. This indication occurs because the samples of the data input stream 110 taken by both the data clock 212 and the second clock 213 are the same for each bit period. When the count 311 exceeds the first threshold value of 64, the count 311 is reset, and the threshold comparator 304 generates a pulse on the second clock phase shift signal 313 to indicate that the phase of the second clock 213 should be advanced toward the second preferred phase. The phase interpolator 308 performs this function as a result, and the phase shift delay circuit 306 transitions to the advance state S1.

Once the second clock 213 has been advanced one phase step, the phase detector 202 detects that the samples of the input data stream 210 clocked by the second clock 213 reside in one earlier bit period compared to those clocked by the data clock 212. The phase detector 202 thus indicates that the data clock 212 leads the first preferred phase for the next series of bit periods by way of the first signal 214. The count 311 is decremented once per bit period until it exceeds the negative of the first threshold of 64, at which point, the threshold comparator 304 issues a pulse for the second clock phase shift signal 313 indicating the second clock 213 should be delayed one phase step toward the second preferred phase, and the count 311 is once again reset. As a result of the second clock phase shift signal 313, the phase shift delay circuit 306 transitions back to the idle state S0 without issuing a pulse on the data clock phase shift signal 312.

At this point, the data clock 212 and the second clock 213 are again sampling the input data stream 210 within the same bit period, causing the phase detector 202 to indicate the data clock 212 lagging the first preferred phase, starting the entire cycle over again. Thus, continuing in this fashion, the phase of the second clock 213 is advanced and delayed back and forth, but the phase of the data clock 212 remains unaltered, thus reducing the overall phase jitter of the data clock 212.

Figure 9:
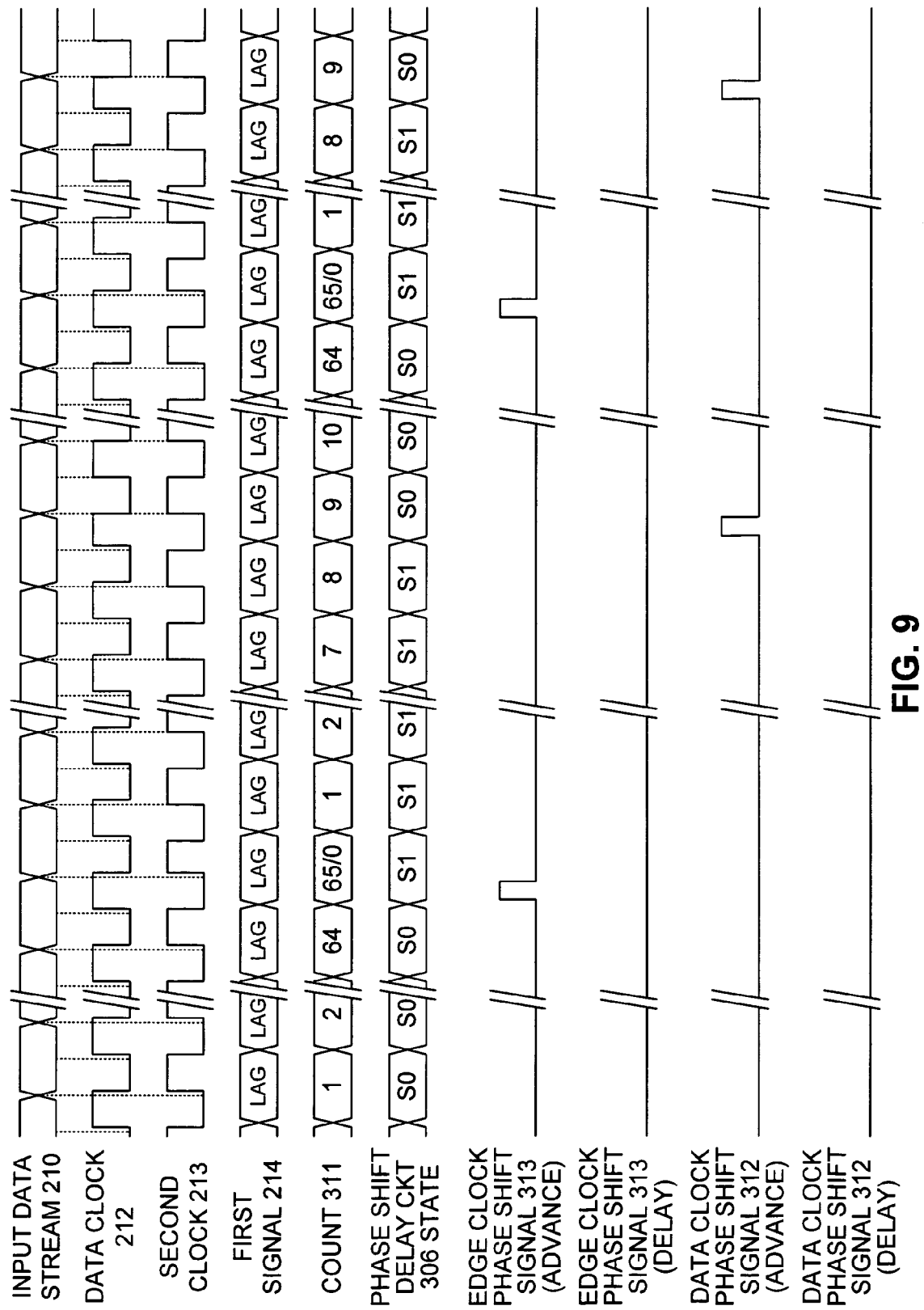
FIG. 9 is a simplified timing diagram illustrating the operation of the data clock recovery system of FIG. 5 employing the phase controller of FIG. 6 according to an embodiment of the invention when the frequency of the data input stream is higher than the frequency of the data clock.

FIG. 9 presents an example of the operation of the data clock recovery system 200 when the frequency of the input data stream 210 is higher than that of the data clock 212 and the second clock 213. Initially, the count 311 is zero, and the phase shift delay circuit 306 exhibits the idle state S0. The data clock 212 and the second clock 213 are again initially sampling within the same bit period of the input data stream 210, so the phase detector 202 indicates via the first signal 214 that the data clock 212 lags the first preferred phase for a series of bit periods. The count 311 is thus incremented once per bit period, ultimately exceeding the first threshold of 64, causing the threshold comparator 304 to issue a second clock phase shift signal 313 pulse to the interpolator 308 to advance the second clock 213 one phase step toward the second preferred phase. The counter 302 resets the count 311, and the phase shift delay circuit transitions to the advance state S1.

However, in this case, the second clock 213 is still sampling the input data stream 210 within the same bit period as the data clock 212, causing the phase detector 202 to continue indicating that the data clock 212 lags the first preferred phase. As a result, the counter 302 continues to increment the count 311. As it exceeds the second threshold of 8, the threshold comparator 304 issues a pulse for the second clock phase threshold signal 315. This pulse causes the state machine of the phase shift delay circuit 306 to transition back to the idle state S0 as a result, and also to generate a pulse for the data clock phase shift signal 312 to advance the data clock 212 one phase step.

While the input data stream 210 samples as clocked by the data clock 212 and the second clock 213 continue to remain within the same bit periods, the phase detector 202 continues to indicate a lag in the data clock 212. As a result, the counter 302 continues to increment the count 311 until it exceeds the first threshold of 64, at which point the threshold comparator 306 issues another pulse for the second clock phase shift signal 313 to advance the second clock 213 further. As before, the count 311 is also reset, and the state machine of the phase shift delay circuit 306 transitions to the advance state S1. Again, the phase detector 202 indicates that the data clock 212 lags the first preferred phase, due to the data clock 212 and the second clock 213 sampling the input data stream 210 within the same bit period. The count 311 is incremented by the counter 302 up through the second threshold of 8, at which point the threshold comparator 304 issues a second pulse for the second clock phase threshold signal 315. Thus, the phase shift delay circuit 306 transitions back to the idle state S0 and generates another pulse for the data clock phase shift signal 312, thus advancing the data clock 212 phase further.

Thus, while the frequency of the input data stream 210 remains higher than the frequency of the data clock 212 and the second clock 213, the phase of the data clock 212 and the second clock 213 will continue to be advanced periodically so that the data clock 212 will remain closely aligned with the first preferred phase.

Figure 10:
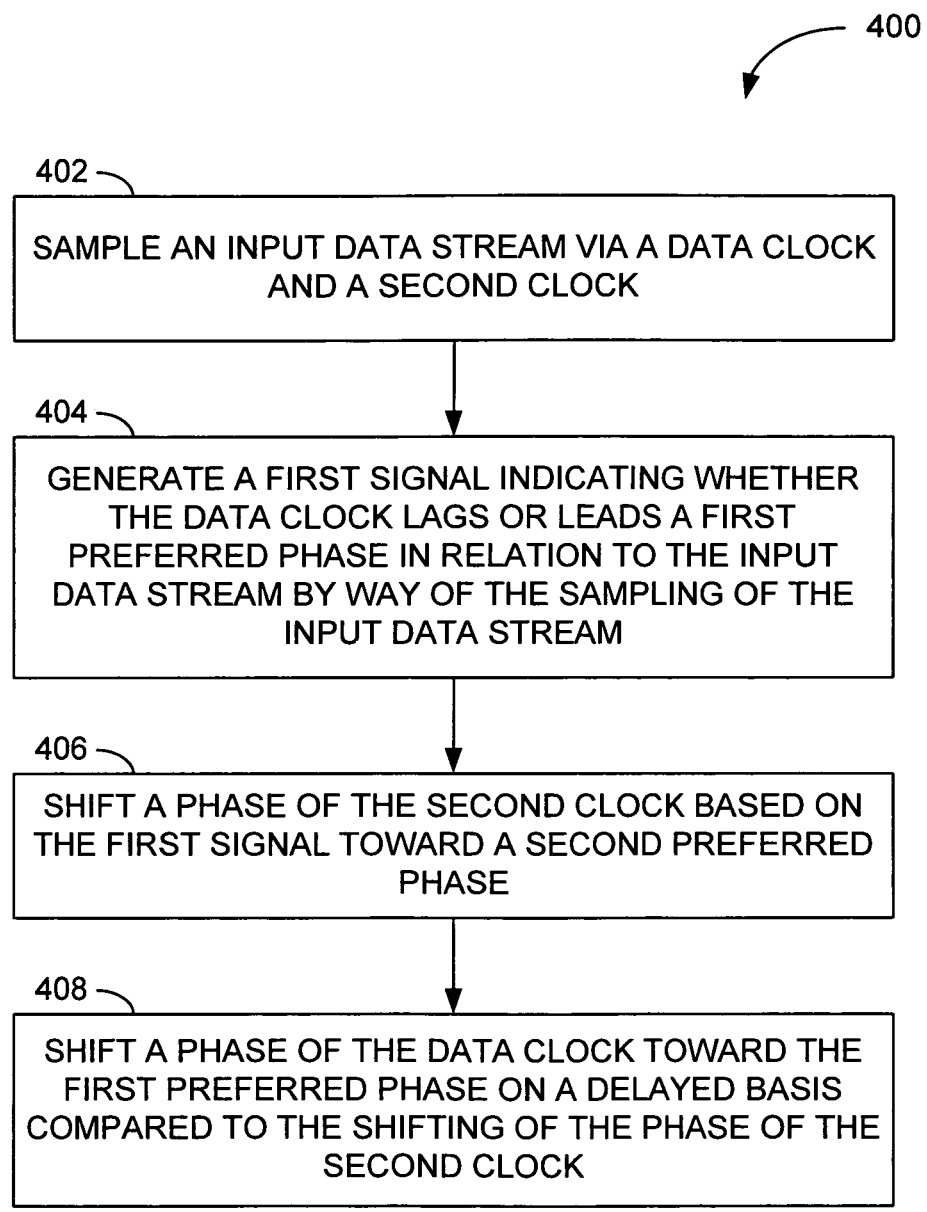
FIG. 10 is a flow chart of a method for recovering clock information from a communication signal according to an embodiment of the invention.

In another embodiment of the invention, a method 400 for recovering data clock information from a communication signal is presented in FIG. 10. A data clock and a second clock sample an input data stream (operation 402). The sampling of the input data stream is employed to generate a first signal indicating whether the data clock lags or leads a first preferred phase in relation to the input data stream (operation 404). In a particular embodiment, the first preferred phase of the data clock aligns with the midpoint between logic transitions of the input data stream. The phase of the second clock is shifted based on the first signal toward a second preferred phase (operation 406). In one embodiment, the second preferred phase of the second clock is aligned closely with the logic transitions of the input data stream. Also, a phase of the data clock is shifted toward the first preferred phase on a delayed basis compared to the shifting of the phase of the second clock (operation 408).

Figure 11:
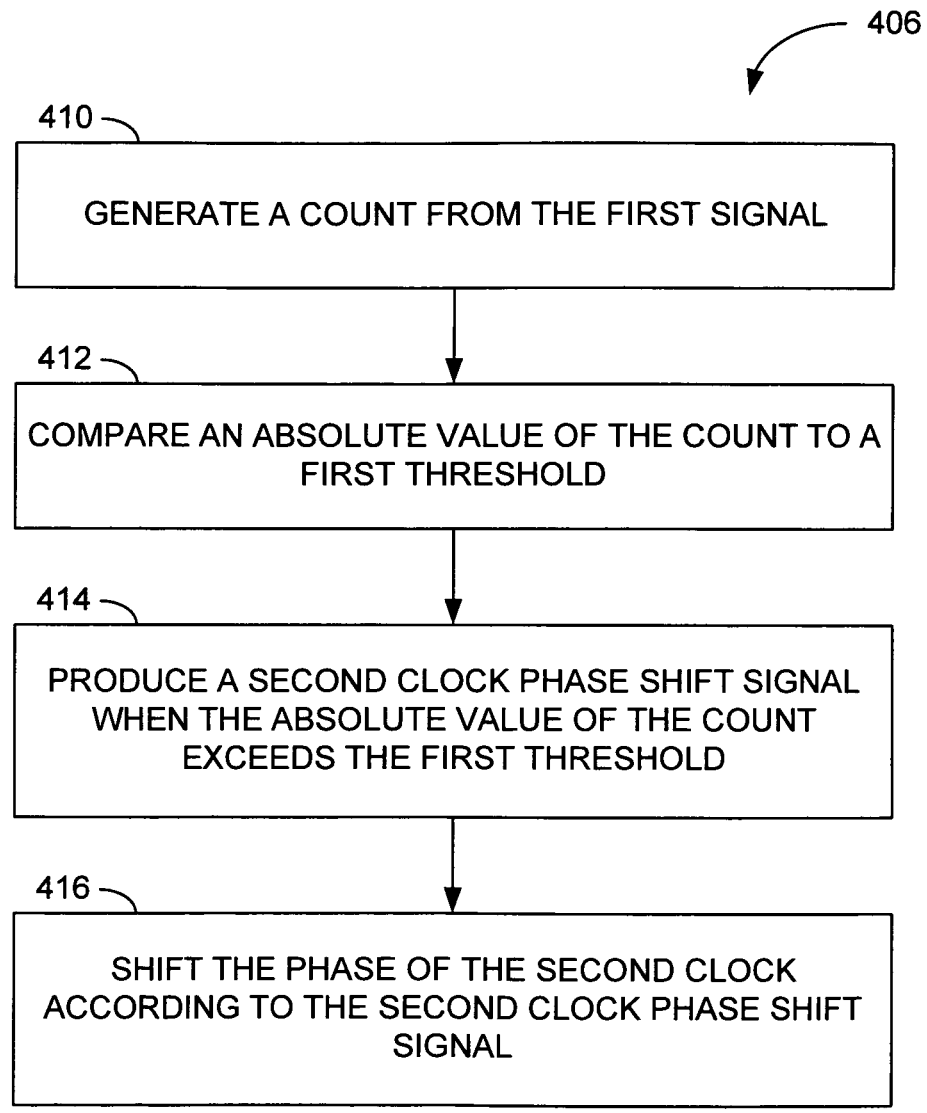
FIG. 11 is a flow chart of shifting a phase of a second clock employed in the method of FIG. 10 according to an embodiment of the invention.

FIG. 11 is a flow chart of how the first signal may be processed in operation 406 according to a particular embodiment of the invention in order to shift the phase of the second clock. The first signal is utilized to generated a count (operation 410), the absolute value of which is compared with a first threshold (operation 412). A second clock phase shift signal is produced when the count absolute value exceeds the first threshold (operation 414). The phase of the second clock is shifted according to the second clock phase shift signal (operation 416).

Figure 12:
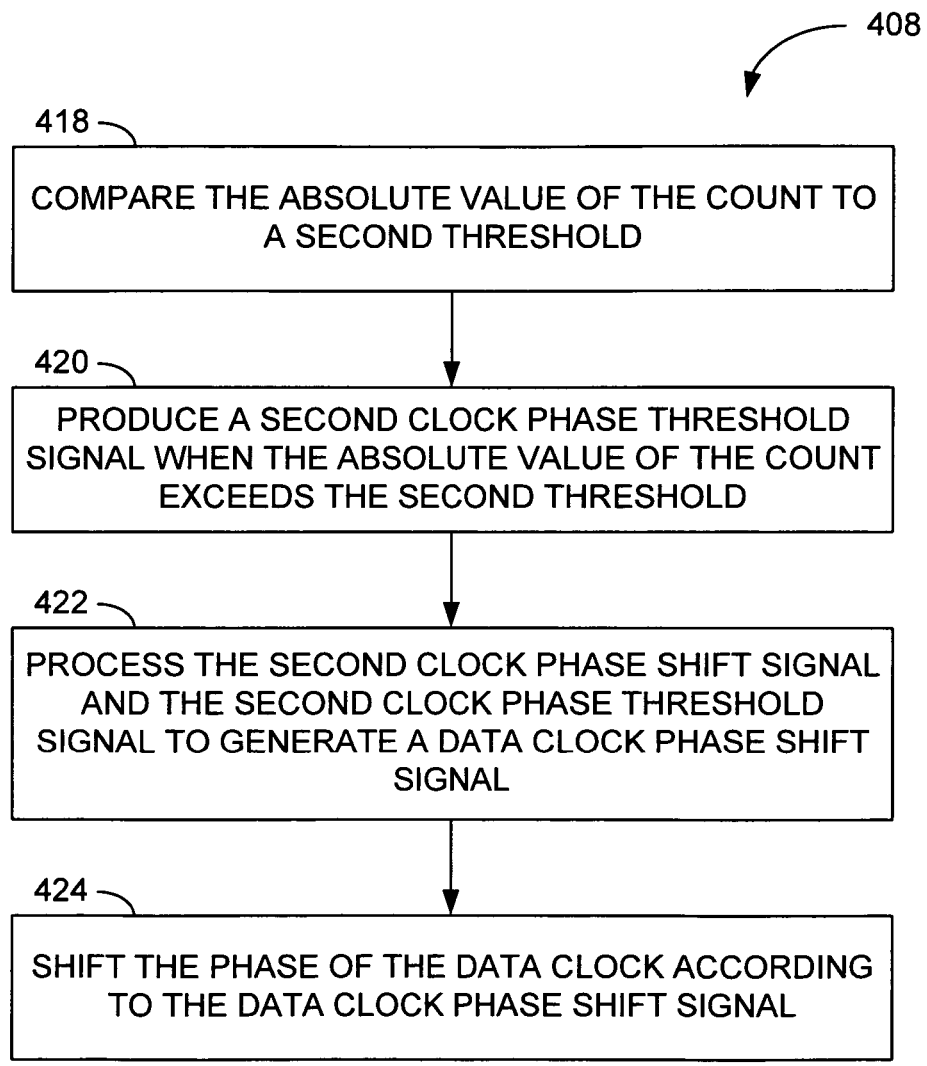
FIG. 12 is a flow chart of shifting a phase of a data clock employed in the method of FIG. 10 according to an embodiment of the invention.

A flow chart illustrating how the second clock phase shift signal is used to shift the phase of the data clock according to an embodiment of the invention is provided in FIG. 12. Both the count and the second clock phase shift signal are processed to generate a data clock phase shift signal (operations 418-422). In one embodiment, the absolute value of the count is compared to a second threshold (operation 418), and a second clock phase threshold signal is produced when the absolute value of the count exceeds the second threshold (operation 420). The second clock phase shift signal and the second clock phase threshold signal are processed to generate the data clock phase shift signal (operation 422). The phase of the data clock is then shifted according to the data clock phase shift signal (operation 424).

Embodiments of the invention described above, as well as alternatives thereof, may be implemented by way of an application-specific integrated circuit (ASIC), a digital signal processor (DSP), a microprocessor, a microcontroller, or any other electronic circuit capable of employing the various functions described while obeying any timing constraints imposed by a particular application.

Referring again to the timing diagrams of FIGS. 8 and 9, delaying the shifting of the phase of the data clock 212 compared to that of the second clock 213 allows the data clock recovery system 200 to reduce unnecessary phase shifts of the data clock 212 when the frequencies of the data clock 212 and the second clock 213 are closely matched. More specifically, if after the phase of the second clock 213 is advanced in response to a lag indication, the data clock 212 is then determined to lead the first preferred phase, the second clock 213 ultimately will be returned to its original phase prior to any phase shift of the data clock 212. Similarly, if the data clock 212 is determined to lead the first preferred phase, and the second clock 213 is delayed as a result, indications that the data clock 212 then consistently lags its first preferred phase will cause the second clock 213 to return to its original phase prior to any phase adjustment of the data clock 212. Thus, any phase jitter will be embodied in the second clock 213, not the data clock 212, thus improving bit error rates and performance in recovering information from the input data stream 210.

While several embodiments of the invention have been discussed herein, other embodiments encompassed by the scope of the invention are possible. For example, while embodiments disclosed herein employ particular signaling conventions, such as the clocking an input data stream on a rising logic transition, many other signaling conventions may be employed in the alternative. Also, while several different types of electronic components have been referenced, others capable of performing the same or similar functions may be employed as well. Further, aspects of one embodiment may be combined with those of alternative embodiments to create further implementations of the present invention. Thus, while the present invention has been described in the context of specific embodiments, such descriptions are provided for illustration and not limitation. Accordingly, the proper scope of the present invention is delimited only by the following claims.

What is claimed is:

1. A data clock recovery system, comprising:
   a phase detector configured to sample an input data stream by way of a data clock and a second clock to generate a first signal indicating whether the data clock lags or leads a first preferred phase in relation to the input data stream; and
   a phase controller configured to process the first signal to shift a phase of the second clock toward a second preferred phase without altering a phase of the data clock, and to shift the phase of the data clock toward the first preferred phase after the shifting of the phase of the second clock.

2. The system of claim 1, the phase controller comprising:
   a counter configured to generate a count from the first signal;
   a threshold comparator configured to generate a second clock phase shift signal when an absolute value of the count exceeds a first threshold, and to generate a second clock phase threshold signal when the absolute value of the count exceeds a second threshold;
   a phase shift delay circuit configured to process the second clock phase shift signal and the second clock phase threshold signal to generate a data clock phase shift signal; and
   a phase interpolator configured to generate the data clock and the second clock, wherein the phase of the data clock is shifted according to the data clock phase shift signal, and wherein the phase of the second clock is shifted according to the second clock phase shift signal.

3. The system of claim 2, wherein the count comprises a first number of periods of the data clock in which the data clock is determined to lag the preferred phase, minus a second number of periods of the data clock in which the data clock is determined to lead the preferred phase.

4. The system of claim 2, wherein the phase interpolator is configured to be driven by a local clock to generate the data clock and the second clock.

5. The system of claim 4, wherein the local clock comprises a multiphase local clock.

6. The system of claim 1, wherein the first preferred phase aligns with a midpoint between logical transitions of the input data stream.

7. The system of claim 1, wherein the second preferred phase aligns with logical transitions of the input data stream.

8. The system of claim 1, wherein the input data stream comprises a serial input data stream.

9. The system of claim 1, wherein the input data stream comprises a parallel input data stream.

10. The system of claim 1, wherein the system is implemented by way of one of an application-specific integrated circuit, a digital signal processor, a microprocessor, and a microcontroller.

11. The system of claim 1 implemented as part of a data communication system.

12. A computer-implemented method for recovering data clock information from a communication signal, the method comprising:
sampling an input data stream via a data clock and a second clock;
generating a first signal indicating whether the data clock lags or leads a first preferred phase in relation to the input data stream by way of the sampling of the input data stream;
shifting a phase of the second clock based on the first signal toward a second preferred phase without shifting a phase of the data clock;
shifting the phase of the data clock toward the first preferred phase on a delayed basis compared to the shifting of the phase of the second clock;
sampling the input data stream according to the phase-shifted data clock where the sampled input data stream is stored in a memory; and
transferring the sampled input data stream to a receiving node.

13. The method of claim 12, wherein shifting the phase of the second clock comprises:
generating a count from the first signal;
comparing an absolute value of the count to a first threshold;
producing a second clock phase shift signal when the absolute value of the count exceeds the first threshold; and
shifting the phase of the second clock according to the second clock phase shift signal.

14. The method of claim 13, wherein shifting the phase of the data clock comprises:
comparing the absolute value of the count to a second threshold;
producing a second clock phase threshold signal when the absolute value of the count exceeds the second threshold;
processing the second clock phase shift signal and the second clock phase threshold signal to generate a data clock phase shift signal; and
shifting the phase of the data clock according to the data clock phase shift signal.

15. The method of claim 12, further comprising generating the data clock and the second clock.

16. The method of claim 13, wherein the count comprises a first number of periods of the data clock in which the data clock is determined to lag the preferred phase, minus a second number of periods of the data clock in which the data clock is determined to lead the preferred phase.

17. The method of claim 12, wherein the data clock and the second clock are derived from a local clock.

18. The method of claim 17, wherein the local clock comprises a multiphase local clock.

19. The method of claim 12, wherein the first preferred phase aligns with a midpoint between logical transitions of the input data stream.

20. The method of claim 12, wherein the second preferred phase aligns with logical transitions of the input data stream.

21. The method of claim 12, wherein the input data stream comprises a serial input data stream.

22. The method of claim 12, wherein the input data stream comprises a parallel input data stream.

23. The method of claim 12, wherein the method is executed by way of one of an application-specific integrated circuit, a digital signal processor, a microprocessor, and a microcontroller.

24. A data clock recovery system, comprising:
means for sampling an input data stream with a data clock and a second clock to yield samples of the input data stream;
means for generating a first signal indicating whether a data clock lags or leads a first preferred phase based on the samples of the input data stream;
means for shifting a phase of the second clock toward a second preferred phase based on the first signal without shifting a phase of the data clock; and
means for shift the phase of the data clock toward the first preferred phase based on the first signal, wherein the shifting of the phase of the data clock is delayed compared to the shifting of the phase of the second clock.

25. The system of claim 24, wherein means for shifting the phase of the second clock comprises:
means for generating a count based on the first signal;
means for producing a second clock phase shift signal when the count exceeds the first threshold; and
means for shifting the phase of the second clock according to the second clock phase shift signal.

26. The system of claim 25, wherein means for shifting the phase of the data clock comprises:
means for comparing the absolute value of the count with a second threshold;
means for producing a second clock phase threshold signal when the absolute value of the count exceeds the second threshold;
means for processing the second clock phase shift signal and the second clock phase threshold signal to generate a data clock phase shift signal; and
means for shifting the phase of the data clock according to the data clock phase shift signal.

27. The system of claim 24, further comprising means for generating the data clock and the second clock.

28. The system of claim 25, wherein the count comprises a first number of periods of the data clock in which the data clock is determined to lag the preferred phase, minus a second number of periods of the data clock in which the data clock is determined to lead the preferred phase.

29. The system of claim 24, wherein the data clock and the second clock are derived from a local clock.

30. The system of claim 29, wherein the local clock comprises a multiphase local clock.

31. The system of claim 24, wherein the first preferred phase aligns with a midpoint between logical transitions of the input data stream.

32. The system of claim 24, wherein the second preferred phase aligns with logical transitions of the input data stream.

33. The system of claim 24, wherein the input data stream comprises a serial input data stream.

34. The system of claim 24, wherein the input data stream comprises a parallel input data stream.

35. The system of claim 24, wherein the system is implemented by way of one of an application-specific integrated circuit, a digital signal processor, a microprocessor, and a microcontroller.

36. The system of claim 24 implemented as past of a data communication system.

* * * * *

UNITED STATES PATENT AND TRADEMARK OFFICE
CERTIFICATE OF CORRECTION

PATENT NO. : 8,467,489 B2
APPLICATION NO. : 11/210929
DATED : June 18, 2013
INVENTOR(S) : Dacheng Henry Zhou et al.

It is certified that error appears in the above-identified patent and that said Letters Patent is hereby corrected as shown below:

In the Claims:

In column 11, line 34, in Claim 12, delete "shifting" and insert -- shift --, therefor.

In column 13, line 11, in Claim 36, delete "past" and insert -- part --, therefor.

Signed and Sealed this
Tenth Day of September, 2013

Teresa Stanek Rea
*Acting Director of the United States Patent and Trademark Office*